United States Patent [19]

Sheth

[11] 4,280,829
[45] Jul. 28, 1981

[54] APPARATUS FOR CONTROLLING INTERNAL PRESSURE OF A BAIT TUBE

[75] Inventor: Kalapi D. Sheth, Houston, Tex.

[73] Assignee: Corning Glass Works, Corning, N.Y.

[21] Appl. No.: 148,953

[22] Filed: May 12, 1980

[51] Int. Cl.³ .......................... B05C 7/00; B05D 7/22
[52] U.S. Cl. ....................................... 65/158; 65/3 A;
65/160; 427/8; 427/163; 427/237; 118/665;
118/725; 118/730; 118/733
[58] Field of Search .................. 65/3 A, 13, 158, 160;
427/8, 163, 166, 237; 118/665, 725, 730, 733

[56] References Cited
U.S. PATENT DOCUMENTS

| | | | |
|---|---|---|---|
| 3,134,694 | 5/1964 | Grabmaier | 118/665 |
| 3,907,536 | 9/1975 | Achener | 65/3 A X |
| 4,154,591 | 5/1979 | French et al. | 65/3 A X |
| 4,165,224 | 8/1979 | Irven et al. | 65/3 A |
| 4,199,335 | 4/1980 | Gliemeroth et al. | 65/3 A X |

FOREIGN PATENT DOCUMENTS

| | | | |
|---|---|---|---|
| 1501586 | 2/1978 | United Kingdom | 65/3 A |
| 1555562 | 11/1979 | United Kingdom | 65/3 A |

OTHER PUBLICATIONS

Okada et al., "Improved Chemical Vapor Deposition. . .", Electronics Letters, vol. 14, No. 4; Feb. 16, 1978; pp. 89, 90.

Primary Examiner—Richard V. Fisher
Attorney, Agent, or Firm—William J. Simmons, Jr.; Walter S. Zebrowski

[57] ABSTRACT

This invention pertains to an apparatus for controlling the diameter of a glass bait tube during the deposition of glassy layers therein. The exhaust end of the bait tube is connected to a vented chamber. A gas source is connected to the chamber by a mass flow controller. A moving hot zone is generated within the bait tube while reactant gases flow therethrough in order to form uniform glassy deposits within the bait tube. An outer diameter monitor measures the bait tube diameter within the hot zone and provides an output signal to a controller which compares the output signal to a set point and provides a control signal to the mass flow controller. By varying the flow of gas into the chamber, the pressure within the bait tube is maintained at the level necessary to provide the desired tube diameter.

4 Claims, 1 Drawing Figure

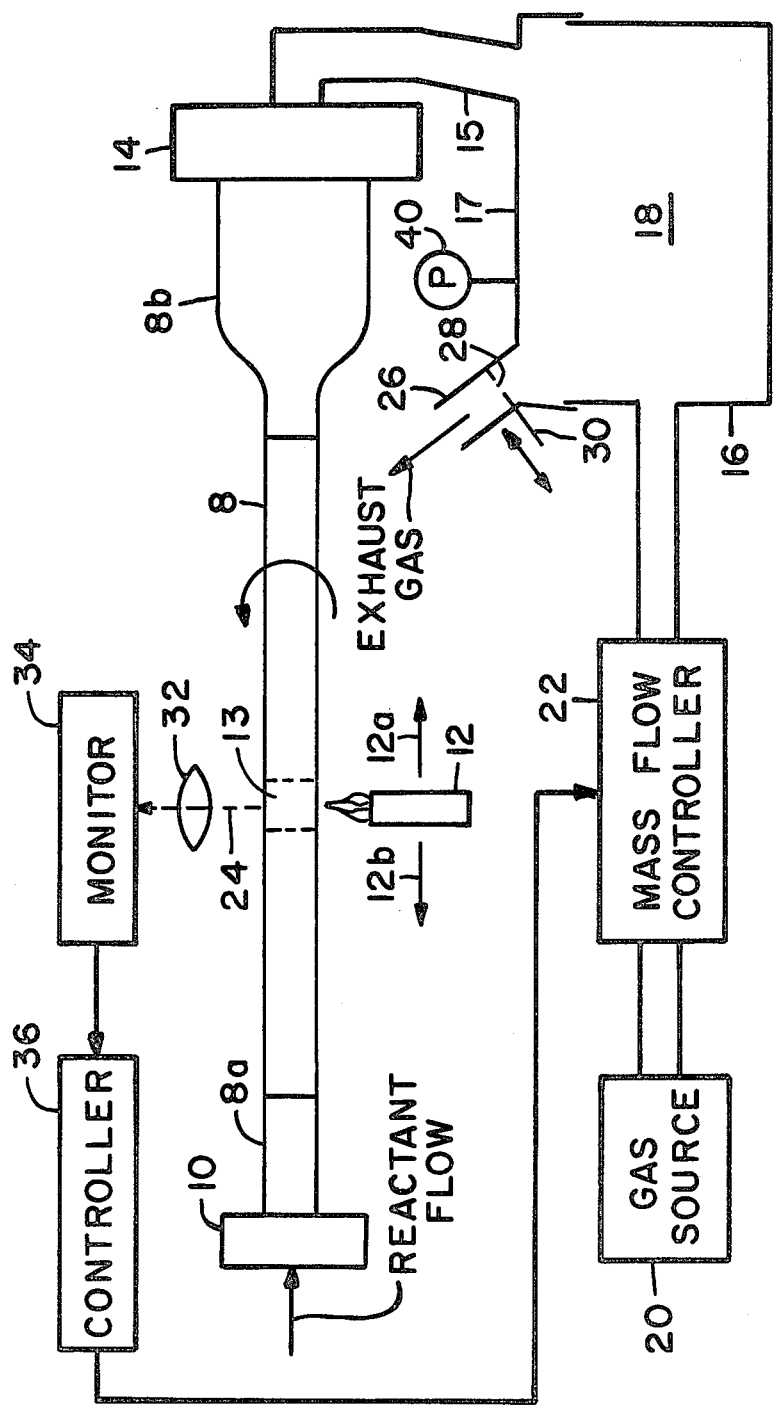

APPARATUS FOR CONTROLLING INTERNAL PRESSURE OF A BAIT TUBE

BACKGROUND OF THE INVENTION

The present invention relates to an apparatus for manufacturing an optical waveguide preform and more particularly, to an apparatus for maintaining the diameter of a preform bait tube during the deposition of glass layers therein.

Vapor deposition process have been commonly employed in the formation of optical waveguide preforms. In one such process, one or more layers of glass are formed on the inner surface of a glass bait tube by chemical vapor deposition or by other known techniques. A vapor phase reaction mixture is caused to flow through the bore of a glass bait tube while heating means such as a gas burner moves longitudinally along the tube to form a moving hot zone within the tube. The reaction mixture reacts in the hot zone to form a reaction product often referred to as "soot" which flows downstream from the hot zone where at least a portion thereof deposits on the inner surface of the tube where it becomes sintered to form a glassy layer. Ordinarily, the coated bait tube has at least two compositional regions. The interior region will ultimately form the core of the resultant optical fiber, and the exterior region will form the cladding thereof. The remaining critical step involves drawing the relatively large diameter cylindrical preform into a small diameter fiber. Prior to drawing the preform into a fiber, the preform is usually collapsed into a smaller diameter preform or preferably into a solid cylindrical mass.

Fibers having out-of-round cores and fibers wherein the core is not concentric with the outer cladding surface incur inordinately high splice losses during the coupling of such fibers. Also, the launching of radiation into an optical fiber and the propagation of the radiation therethrough can be adversely affected by fibers having nonuniform geometries. An optical fiber having the desired geometrical properties of circularity and concentricity can only be obtained from a preform having the same geometry. However, even when a circular bait tube is employed, the resultant preform may posses nonuniformities introduced during the deposition process. With each glass deposition pass of the heating means, the bait tube shrinks by a small amount due to surface tension, and when a burner is employed, the burner gas forces add to the tube shrinkage. Cumulatively, this effect can deform the bait tube geometry, thereby causing it to become out-of-round.

DESCRIPTION OF THE PRIOR ART

British Pat. No. 1,555,562 teaches a chemical vapor deposition process including the steps of forming by a chemical vapor deposition process one or more vitreous layers on the interior surface of a glass tube which is initially of circular cross-section both externally and internally. During the deposition process, pressure slightly in excess of the ambient atmospheric pressure is maintained within the bore of the tube, the excess pressure being for the purpose of counteracting the tendency for collapse or distortion of the tube to occur during the deposition as a result of the externally applied heat. To effect that result, a restriction is formed in the output end of the bait tube. The resulting restriction of the rate of egress of the gaseous mixture from the tube causes the build-up of sufficient pressure to maintain the circularity of the tube during the deposition process. The use of a such a restriction is disadvantageous in that it invites the deposition of reaction product in the restricted area, an occurrence which would tend to block the vapor outflow orifice. The tendency for blockage of the restricted orifice is reduced by continually heating the orifice with an additional burner. That system also fails to include any means for adjusting the pressure within the bait tube.

A system for controlling the pressure within the bait tube during the deposition process is disclosed in the publication "Improved Chemical Vapour Depoosition Method for Long-length Optical Fibre" by M. Okada et al., Electronics Letters, Feb. 16, 1978, Vol. 14, No. 4, pp. 89 and 90. That publication teaches an apparatus comprising a conical exhaust tube and a centrally located conical flow restrictor disposed at the exhaust end of the bait tube. An apparatus employing a laser beam constantly monitors the outer diameter of the bait tube. A signal from the monitoring apparatus is fed to a controller which adjusts the longitudinal position of the concial stopper within the conical exhaust tube. The internal pressure within the bait tube is controlled by varying the area of the orifice between these two conical members. This apparatus is disadvantageous in that the conical stopper is located directly in the path of the exhaust soot which will therefore tend to deposit thereon. Also, precise pressure control appears to be difficult to achieve due to the small size of the orifice apertures, and the total practical range of internal pressure achievable by that apparatus appears to be narrow due to mechanical considerations.

SUMMARY OF THE INVENTION

It is therefore an object of the present invention to provide an apparatus for controlling the pressure within a bait tube over a wide range of pressures during the deposition process.

The present invention relates to apparatus for depositing a layer of glass on the inner surface of a glass bait tube. Such apparatus conventionally comprises means for rotatively supporting the bait tube and means for introducing an input gas into the tube. Means is provided for receiving exhaust gas flowing from one end of the tube. Heating means is provided for forming a hot zone within the tube. The diameter of the tube is monitored in the region of the hot zone by a device which provides a signal to means for controlling the pressure within the tube, thereby controlling the outer diameter thereof. In accordance with the present invention, the pressure control means is characterized in that it comprises means defining a chamber, means connecting the exhuast gas receiving means to the chamber, and means responsive to the signal from the monitor means for controlling the pressure within the chamber.

BRIEF DESCRIPTION OF THE DRAWING

The FIGURE is a schematic representation of an apparatus by means of which the present invention may be practiced.

DESCRIPTION OF THE PREFERRED EMBODIMENT

The sole FIGURE is a schematic representation of an otherwise standard vapor deposition apparatus modified so as to be applicable to the practice of this invention. This system comprises substrate or bait tube 8 having handle tube 8a affixed to the upstream end thereof and exhaust tube 8b affixed to the downstream end thereof. Tubes 8a and 8b are chucked in a conventional glass turning lathe (not shown), the rotating couplings 10 and 14 of which are illustrated. The combination of bait tube, handle tube and exhaust tube is rotated as indicated by the arrow. The handle tube, which may be omitted, is an inexpensive glass tube having the same diameter as the substrate tube, and it does not form a part of the resultant optical waveguide.

A hot zone 13 is caused to traverse tube 8 by moving heating means 12 as schematically depicted by arrows 12a and 12b. Heating means 12 can consist of any suitable source of heat such as a plurality of burners encircling tube 8. However, since the particular heat source is not critical to the practice of this invention, any appropriate source may be utilized, e.g., an electric resistive heat source, an oven, or the like. Burner 12 initially moves at a low rate of speed relative to tube 8 in the direction of arrow 12a, the same direction as the reactant flow. The reactants react in the hot zone to produce soot, i.e., a powdery suspension of particulate oxidic material, which is carried downstream by moving gas where at least a portion thereof deposits on the inner surface of the tube, particularly in the region immediately adjacent to the hot zone. As burner 12 continues to move in the direction of arrow 12a, the hot zone moves downstream so that a part of the soot buildup extends into the hot zone and is consolidated thereby to form a unitary, homogeneous glassy layer. Such process parameters as temperatures, flow rates, reactants and the like can be found in the publications J.B. MacChesney et al., Proceedings of the IEEE, 1280 (1974) and W. G. French et al. Applied Optics, 15 (1976). Reference is also made to the text *Vapor Deposition* edited by C. F. Powell et al. John Wiley and Sons, Inc. (1966).

When burner 12 reaches the end of tube 8 adjacent to exhaust tube 8b, the temperature of the flame is reduced and the burner returns in the direction of arrow 12b to the input end of tube 8. Thereafter, additional layers of glassy material are deposited within tube 8 in the manner described above.

After suitable layers have been deposited to serve as the core material and any other desired layers of the resultant optical fiber waveguide, the temperature of the glass is increased to cause tube 8 to collapse. This can be accomplished by reducing the rate of traverse of the hot zone. Preferably, the interior of tube 8 is pressurized during collapse as taught in U.S. Pat. No. 4,154,591 issued to W. G. French et al.

The resultant draw blank is then drawn in accordance with well-known techniques to form an optical waveguide filament having the desired diameter.

An improved apparatus for maintaining within the bait tube the pressure necessary for maintaining the desired tube OD is shown in the FIGURE. Exhaust tube 8b is connected by way of rotating coupling 14 and conduit 15 to pressure chamber 18 which is formed by housing 16 and lid 17. A source 20 of a gas such as oxygen, nitrogen or the like is connected by mass flow controller 22 to chamber 18. Both the exhaust gases from tube 8 and the gas flowing from controller 22 are exhausted through a conduit 26 which may be provided with an orifice 28 which is adjustable by means of a movable vane 30.

The diameter of tube 8 is monitored in the region of the hot zone by a monitor 34 which may consist of a reticon camera containing a photodiode array and its associated electronics. The output of the camera is a sampled and held analog voltage. A commercially available model LC 100 reticon camera emloys a diode array containing 1728 elements on 15$\mu$ centers with an aperture of 11 mils. The portion of tube 8 being heated by burner 12 emits radiation 24 which is focused by a lens system 32 onto the diode array of the reticon camera and the resultant output signal is coupled to controller 36 which controls the pressure within tube 8 by regulating the flow of gas through mass flow controller 22 in such a manner as to tend to reduce the variation of the diameter of tube 8 from a set point level.

Instead of relying on radiation emanating from tube 8 due to the high temperature thereof, a laser beam could be directed to the tube, and the monitor could be employed to detect reflected or refracted light.

Since soot accompanies the exhaust gases which flow into chamber 18, it is advantageous to provide housing 16 with lid 17 which can be removed to facilitate soot removal. Means such as a rotating auger (not shown) may be employed for removing soot tending to collect in conduit 26. A gauge 40 may be provided for monitoring the pressure in chamber 18.

The above described apparatus is capable of controlling the diameter of tube 8 throughout the preform manufacturing process. As described in the aforementioned French et al. patent, it may be desirable to increase the diameter of the bait tube prior to the deposition process in order to improve tube circularity. The aforementioned British Pat. No. 1,555,562 and Electronics Letters publication teach the desirability of maintaining tube diameter during the deposition process. Regarding this portion of the preform manufacturing process, it is noted that when the temperature of the hot zone is made sufficiently high to deposit pure silica on the inner surface of tube 8, that tube can, due to surface tension and burner force, collapse into a solid rod within as few as 5 burner passes unless the internal pressure thereof is increased. Finally, the French et al. patent also teaches the beneficial results of maintaining a positive pressure within the bait tube during its collapse after the layer or layers of glass are deposited therein. The disclosed apparatus is capable of maintaining the desired tube OD during all of the aforementioned portions of the preform manufacturing process. This apparatus is capable of responding quickly to provide the necessary bait tube pressure.

I claim:

1. In an apparatus for depositing a layer of glass on the inner surface of a glass bait tube comprising
   means for rotatively supporting said tube,
   means for introducing an input gas into said tube,
   means for receiving exhaust gas flowing from one end of said tube,
   means for heating said tube to form a hot zone therein,
   means for monitoring the diameter of said tube in the region of said hot zone, and
   means for controlling the pressure within said tube, thereby controlling the outer diameter of said tube, said means for controlling being characterized in that it comprises
   means defining a chamber,
   means connecting said means for receiving exhaust gas to said chamber, and
   means responsive to said monitoring means for controlling the pressure within said chamber.

2. An apparatus in accordance with claim 1 wherein said means for controlling the pressure within said chamber comprises means providing a source of gas, means for controlling the flow of said source gas into said chamber, a control circuit responsive to a signal provided by said monitoring means for providing a signal to said flow control means, and means for venting said chamber.

3. An apparatus in accordance with claims 1 or 2 wherein said chamber defining means comprises a housing with a removable lid.

4. An apparatus in accordance with claim 2 wherein said venting means is variable.

* * * * *